United States Patent [19]

Diazzi et al.

[11] Patent Number: 5,552,731
[45] Date of Patent: Sep. 3, 1996

[54] INTEGRATED CONTROL CIRCUIT WITH A LEVEL SHIFTER FOR SWITCHING AN ELECTRONIC SWITCH

[75] Inventors: Claudio Diazzi, Milan; Fabrizio Martignoni, Varese; Mario Tarantola, Milan, all of Italy

[73] Assignee: SGS-Microelectronics S.r.l., Agrate Brianza, Italy

[21] Appl. No.: 529,882

[22] Filed: Sep. 18, 1995

[30] Foreign Application Priority Data

Sep. 16, 1994 [EP] European Pat. Off. ............. 94830436

[51] Int. Cl.$^6$ .......................... H03K 17/16; H03K 3/00
[52] U.S. Cl. ................. 327/109; 327/382; 327/427; 327/566
[58] Field of Search ...................... 327/427, 430–437, 327/108–112, 379, 382, 389, 391, 170, 134, 380, 381, 198, 199, 217, 215, 219, 306, 308, 310, 327, 328, 564–566; 326/21, 26, 27, 82–87

[56] References Cited

U.S. PATENT DOCUMENTS

| | | | |
|---|---|---|---|
| 4,677,324 | 6/1987 | Ronan, Jr. et al. | 327/377 |
| 4,937,468 | 6/1990 | Shekhawat et al. | 327/108 |
| 4,942,309 | 7/1990 | Chieli | 327/109 |
| 5,105,099 | 4/1992 | Routh et al. | 307/270 |
| 5,126,603 | 6/1992 | Hattori | 307/571 |
| 5,134,322 | 7/1992 | Bourgeois et al. | 327/381 |
| 5,365,118 | 11/1994 | Wilcox | 327/109 |

FOREIGN PATENT DOCUMENTS

| | | | |
|---|---|---|---|
| 0330628 | 8/1989 | European Pat. Off. | H03K 17/06 |
| 0397241 | 11/1990 | European Pat. Off. | H03K 17/16 |

OTHER PUBLICATIONS

Anonymous, "Double circuit de commande pour MOSFET de puissance ou IGBT haute tension," *Electronique Applications* 63:33–38, Dec. 1988, Paris, France.

*Primary Examiner*—Toan Tran
*Attorney, Agent, or Firm*—David V. Carlson; Harry K. Ahn; Seed and Berry

[57] ABSTRACT

A circuit for controlling a power transistor connected in series with a load. The circuit comprises a control logic circuit which produces a signal at two levels with respect to a reference terminal, a level shifter connected between the control circuit and the power transistor, and which produces a signal at two levels referred to the node between the power transistor and the load. The level shifter includes a flip-flop the output of which controls the power transistor as well as two transistors driven by the control logic circuit to switch alternately and provide switching signals on the "set" and "reset" inputs of the flip-flop via two resistors. Two parasitic current generators inject current into the two resistors during the phase in which the power transistor is cut off. To prevent this current from causing unwanted switching of the flip-flop, a resistor connected to the "set" terminal of the flip-flop has a lower resistance than that of the other resistor.

16 Claims, 3 Drawing Sheets

INTEGRATED CONTROL CIRCUIT WITH A LEVEL SHIFTER FOR SWITCHING AN ELECTRONIC SWITCH

CROSS-REFERENCE TO RELATED APPLICATION

This application is being filed concurrently with a related U.S. Patent Application entitled "A Control Circuit With a Level Shifter For Switching an Electronic Switch", No. 08/529,883, (Seed and Berry Docket No. 851063.414).

TECHNICAL FIELD

The present invention relates to switching control circuits for electronic power switches and, more particularly, to a circuit of this type including a control signal level shifter.

BACKGROUND OF THE INVENTION

One known application of electronic power switches is in forming bridge circuits for the actuation of motors. These circuits include pairs of electronic switches connected in series between the poles of a high voltage power supply. The load, in this case a winding of the motor, is connected between the connection points of the pairs of switches. The switches of each pair are controlled in such a way that at any instant at most one of the two is closed. That is to say that both switches of a pair cannot be simultaneously closed.

The electronic switches are controlled by low voltage logic circuits which produce control signals at two levels relative to a reference voltage which, normally, is also the earth terminal of the circuit arrangement. For controlling the switches of the bridge connected to the positive pole of the power supply, the level of the logic circuit signals is shifted by means of suitable level shifter circuits.

A typical structure of a control circuit with a level shifter is schematically represented in FIG. 1. Four power transistors, for example, field effect transistors (FET) of n channel DMOS type, indicated as T1, T2, T3 and T4 are connected in series in pairs between the terminals, indicated with the earth symbol and $V_H$, of a relatively high voltage DC power supply, for example 300 volts. A load L, for example a winding of a motor, is connected between the connection nodes of the switches of the two pairs. A control logic circuit, indicated as LG, produces control signals at two voltage levels, for example the ground level, or zero, and a relatively low supply voltage level $V_{LL}$ typically five volts. These signals, available on the outputs of the logic circuits LG are applied to the control terminals, that is to say the gate electrodes both of the "lower" transistors T2, T4 through respective driving circuits, and the "upper" transistors T1, T3, through respective level shifting and driving circuits, to switch the transistors on or off (conduction or cut-off) according to the sequence determined by the logic circuit LG. For simplicity of the drawing, only the driving circuits DR1 and DR2 for the transistors T1 and T2 and only the level shifter LS1 relating to the transistor T1 are shown; it is understood that similar circuits are provided for control of the transistors T3 and T4.

The driving circuit (DR2) of the transistor T2 is supplied with a relatively low voltage $V_L$, for example 12 volts, sufficient to raise the gate electrode of T2 to a voltage, with respect to its source terminal (which is connected to ground) greater than the conduction threshold. The driving circuit DR1 of the transistor T1 is supplied with a voltage $V_C$ the value of which is substantially equal to $V_L$ provided by a "buffer" capacitor C connected between the connection node S1 (between the two transistors T1 and T2) and a charging circuit, not shown, the function of which is to maintain the capacitor C charged to the voltage $V_C$.

The level shifter LS1 includes two substantially identical circuit branches each constituted by an n channel MOS transistor M1, M2 the source terminal of which is connected to the ground terminal and the drain terminal of which is connected to the supply terminal $V_C$ via the parallel connection of a resistor R1, R2 and a Zener diode D1, D2. The gate terminals of the transistors M1 and M2 are connected to an output of the logic circuit LG, one directly and the other through an inverter INV1, such that the control signals which arrive at the two transistors are always complementary to one another.

The level shifter LS1 also includes a bistable (flip-flop) circuit, indicated as RS, supplied with the voltage $V_C$, and having "set" and "reset" terminals S, R respectively, connected via respective inverters INV2 and INV3 to the drain electrodes, respectively, of transistors M1 and M2, and an output terminal Q connected to the input of the driving circuit DR1 of transistor T1.

The logic operations of the R-S flip-flop are set forth in the following truth table.

| Rn | Sn | Qn + 1 |
|----|----|--------|
| 0  | 0  | Qn     |
| 0  | 1  | 1      |
| 1  | 0  | 0      |
| 1  | 1  | Indeterminate |

In operation, the two transistors M1 and M2 are alternately brought to a conduction state by signals generated by the logic circuit LG. The current pulses which form in succession in the two resistors R1 and R2 produce the "set" and "reset" signals at the inputs S and R of the flip-flop RS. Consequently, the voltage level of the output signal Q from the flip-flop, relative to the voltage level of the node S1 (which varies substantially between 0 and $V_H$ based on the state of conduction of the transistors of the bridge), causes the driving circuit DR1 to apply a voltage signal between the gate and source electrodes of the transistor T1, a voltage signal which switches on or off the transistor T1.

The circuit described above can be improved, in a manner which will be illustrated hereinbelow, to ensure that during switching of the node S1 between 0 and $V_H$, both the inputs of the flip-flop are at low level. However, both the circuit of FIG. 1 and the thus-improved circuit are subject, when formed as part of a monolithic integrated circuit, to possible spurious switching such that they cannot be utilized when it is essential to achieve absolute security in operation of the transistor bridge.

Spurious switching is due to the structure capacitances associated with the transistors M1 and M2. These capacitances, generally indicated as C1 and C2 in FIG. 1, are the sum of the capacitances between drain and source and between drain and substrate. In certain conditions, as will be explained in more detail hereinbelow in relation to a particular circuit, during discharge of these capacitances, which takes place in part through the Zener diodes, D1 and D2 and in part through the resistors R1 and R2, the conduction of parasitic components is triggered due to the structure of the integrated circuit in which the various components of the switching control circuit are formed, which can lead to switching signals at the flip-flop which are not those caused by the control signal and which can therefore cause very serious malfunctions.

3

The object of the present invention is to provide a switching control circuit with a level shifter for an electronic power switch in which spurious switching is not possible in any case.

SUMMARY OF THE INVENTION

According to the principles of the present invention, an integrated control circuit for switching an electronic power switch for driving a load device is provided. The integrated control circuit comprises a control logic circuit that produces two different voltage levels, and a level shifter whose input is connected to the control logic circuit. Based on the output of the control logic circuit, the level shifter produces two different shifted voltage levels for controlling the electronic power switch connected to the load device. The load device, for example, may be a winding of an electric motor. The level shifter includes a bistable stage, a first circuit branch and a second circuit branch. The bistable stage generally has a set input connected to the first circuit branch and a reset input connected to the second circuit branch. Each circuit branch includes a transistor and a resistor connected in series. The transistors of the circuit branches are switched in a predetermined sequence based on the voltage levels produced by the control logic circuit. According to one aspect of the present invention, the resistor of the second circuit branch has a higher resistance value than the resistor of the first circuit branch to ensure that the voltage level at the set input of the bistable stage falls faster than the reset input of the bistable stage during discharge of parasitic capacitors associated with the transistors of the circuit branches. According to another aspect of the present invention, certain circuit components of the level shifter are selectively positioned such that during discharge of the parasitic capacitors associated with the circuit branch transistors, the current flowing through the resistor of the second circuit branch is higher than the current flowing through the first resistor.

BRIEF DESCRIPTION OF THE DRAWINGS

The invention will be better understood from the following detailed description of an exemplary, and therefore non-limiting embodiment in relation to the attached drawings, in which.

DETAILED DESCRIPTION OF THE INVENTION

Figure 1:
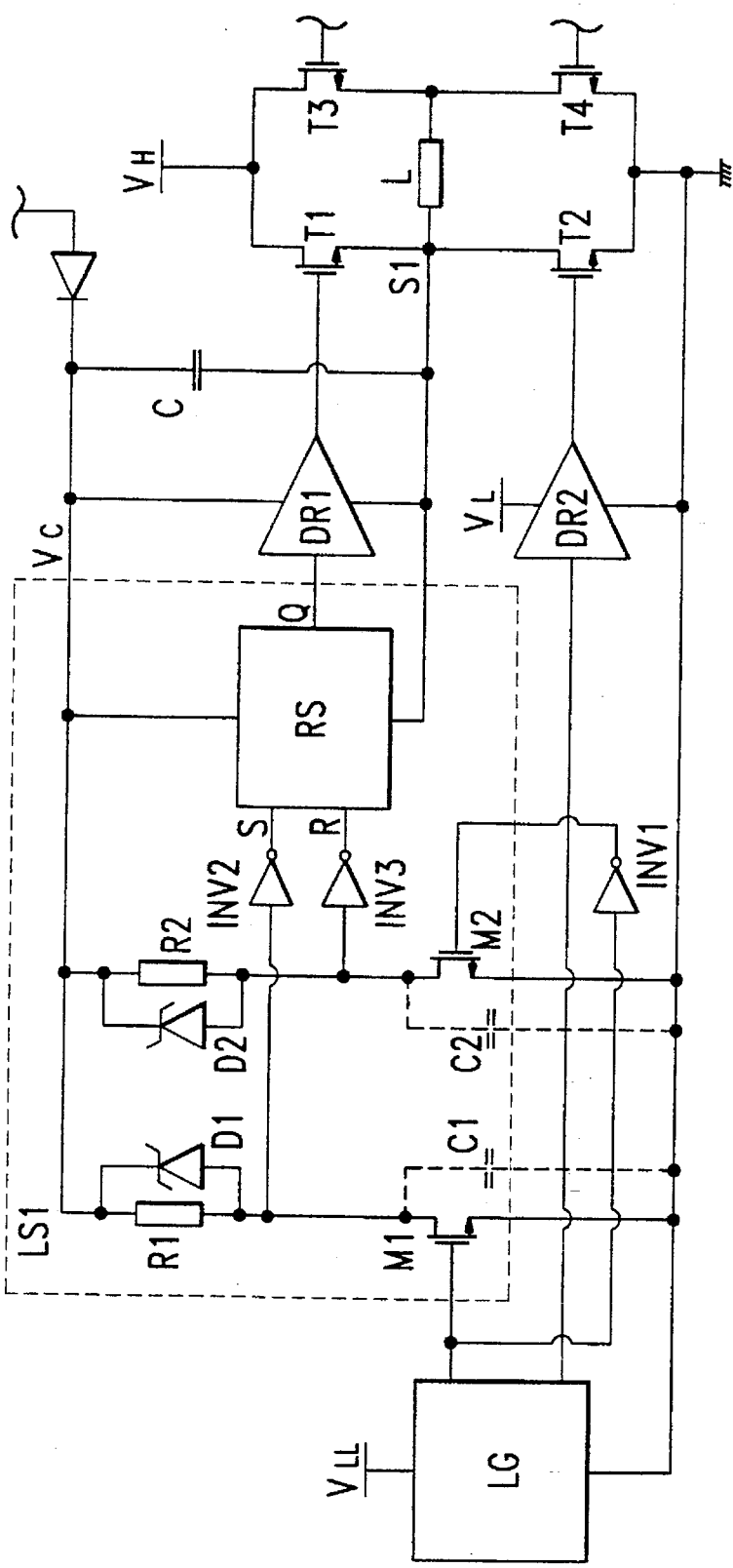
FIG. 1 is a diagram of a prior art switching control circuit applied to a transistor bridge.
Figure 2:
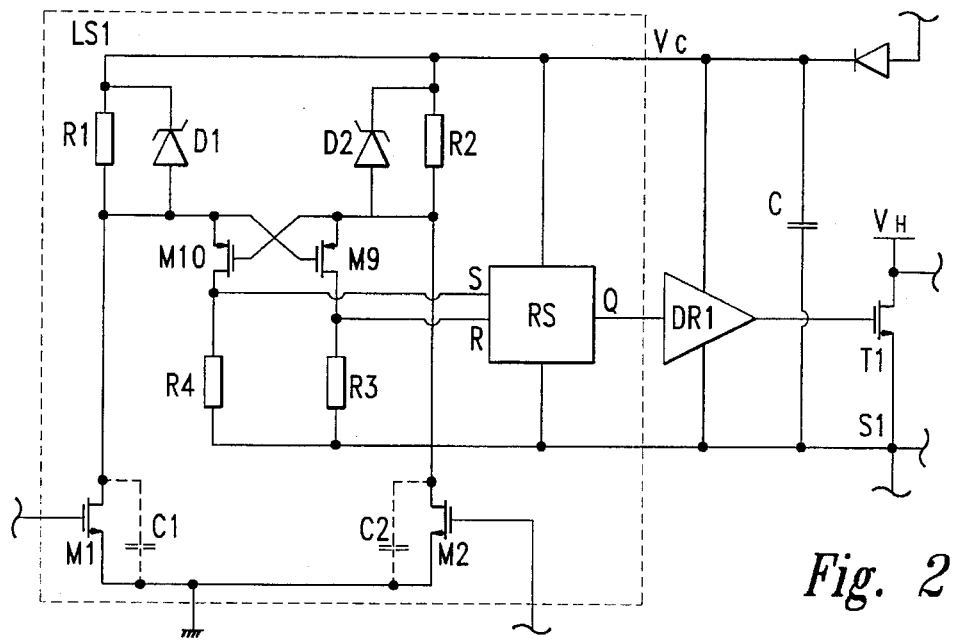
FIG. 2 is a diagram of a switching control circuit to which the present invention is applied.

The circuit of FIG. 2, in which parts which are the same as or correspond to those of FIG. 1 are indicated with the same reference symbols, is different from that of FIG. 1 substantially in that the input terminals S and R of the flip-flop RS are not connected to the drain electrodes of the transistors M1 and M2 through inverters, but through a coupling stage which comprises two p-channel MOSFETs, indicated as M9 and M10. These are each connected with a respective series resistor R3 and R4 between the drains of the transistors M2 and M1 and the node S1, and have their gate electrodes connected to the source electrode of the other transistor of the pair.

The current injected alternately into the resistors R1 and R2 during conduction of the transistors M1 and M2 respectively, causes conduction of the transistors M9 or M10 respectively such that across the resistors R3 or R4 there is a voltage drop which gives rise to the "reset" or "set" signals on the flip-flop RS. This circuit offers the advantage over the circuit of FIG. 1 of maintaining the condition of low level signals S=0, R=0 on both inputs of the flip-flop during switching of the node S1. This is important in particular when the node S1 switches to a high voltage level, that is to say varies from 0 to $V_H$.

Figure 3:
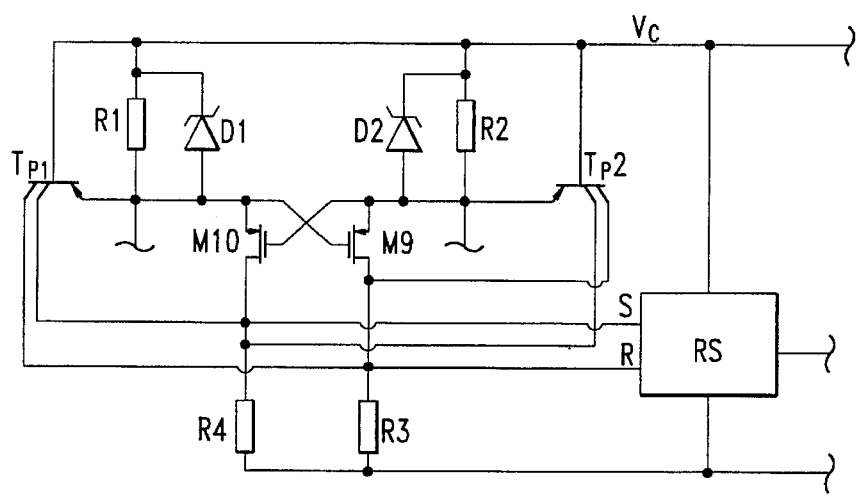
FIG. 3 is a detailed diagram of a portion of the circuit of FIG. 2 in which parasitic components not shown in FIG. 2 are illustrated.
Figure 4:
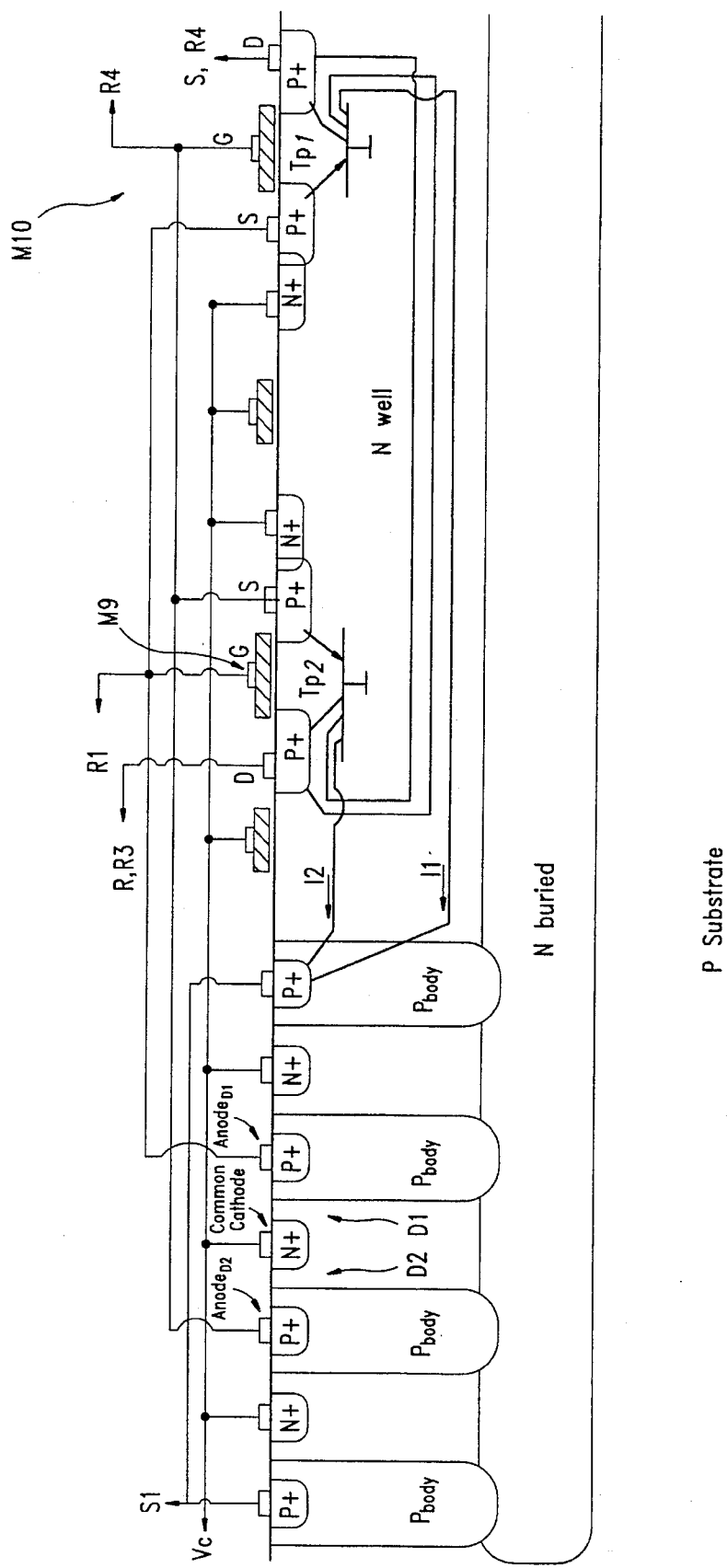
FIG. 4 is a cross-sectional view of a portion of the circuit of FIG. 3 and illustrates the parasitic components.

However, discharge of the capacitances C1 and C2 can cause spurious signals. In particular, if the circuit of FIG. 2 is made as an integrated circuit using conventional fabrication techniques, parasitic bipolar transistors of pnp type are formed which constitute parasitic current generators associated with the p-channel MOSFET transistors M10 and M9, and the effect of which can be evaluated by examining the equivalent diagram of FIG. 3 and the cross-sectional view of the parasitic transistors in FIG. 4. As is seen, FIGS. 3 and 4 show two double collector transistors indicated as Tp1 and Tp2, each having its emitter region in common with the source region of a respective p-channel MOSFET transistor M10 and M9, its base region connected to the supply terminal $V_C$ and two collector regions in common with the drain regions of M10 and M9, which are connected to the input terminals S and R of the flip-flop. In the discharge phase of the capacitances C1 and C2, the two transistors Tp1 and Tp2 inject a current into the resistors R3 and R4. This takes place, in particular, in the switching phase of the node S1 from the higher level to the lower level when the power transistors T1 and T2 are, respectively, off and on. In this phase both the inputs of the flip-flop are at the higher level, that is to say in a state which does not in general correspond to a well defined output state of the flip-flop. To prevent this condition from causing an output of the flip-flop corresponding to a switching on of the power transistor T1, it is advisable to utilize a flip-flop of the "dominant reset" type, that is to say the type that has a low output level when the inputs are both at high level. However, even in this case, at the end of the transition of the node S1 from $V_H$ to 0 with the transistor T1 in the cut-off state, there is the risk that the flip-flop will receive an input condition which would take the transistor T1 back into conduction during the conduction of the lower transistor T2, this situation being highly undesirable. In fact, the voltage levels on the inputs S and R of the flip-flop, once the parasitic injection has ceased, tend to fall to the level of the node S1 gradually so that the capacitances associated with the two terminals S and R discharge through the resistors R4 and R3 until the so-called memory state (S=0, R=0) of the flip-flop is reached. In this condition, the output state Q will be determined by that of the two levels which falls fastest. For example, in the case of a more rapid fall of the input R there would be the unwanted condition of S=1, R=0 which would take the power transistor T1 into conduction.

According to the invention, in order to prevent this condition from occurring the resistor R3, connected to the "reset" input (R) has a greater resistance than that of the resistor R4 connected to the "set" input (S). Thus, with the same charge injected by the parasitic generators into the resistors R3 and R4, the level of the "set" terminal falls more rapidly than that of the "reset" terminal-by the effect of the smaller time constant, so that at the end the output Q always corresponds to the state S=0, R=1.

In another embodiment of the invention the layout of the integrated circuit, that is to say the arrangement of the circuit components, is chosen in such a way that, during switching, the overall currents injected by the two parasitic current generators into one resistor and into the other resistor are not equal to one another but such that the overall current injected into the resistor connected to the "reset" input (R) is greater than that injected into the other resistor. In this case, even if the resistors R3 and R4 are equal, the level of the "set" terminal falls more rapidly than that of the "reset" terminal because the charge of the capacitance associated with the "set" terminal will be less than that of the capacitance associated with the "reset" terminal.

Figure 5:
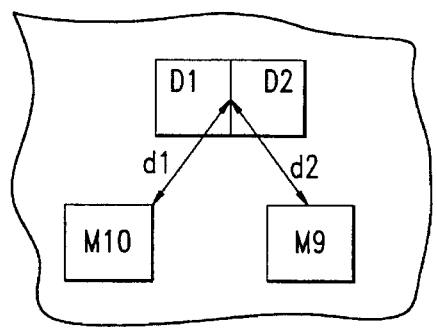
FIG. 5 schematically shows the relative arrangement of some components of the integrated circuit according to one aspect of the present invention.

One way of obtaining this result is to dispose the transistors M10 and M9 at a different distance from the center of the areas in which the associated diodes D1 and D2 are formed. For example, as shown in FIGS. 4 and 5, the distance d1 between M10 and the diodes D1 and D2 is greater than the distance d2 between M9 and the same pair of diodes. In FIG. 5, the distance d1 corresponds to a current path I1 and the distance d2 corresponds to a current path I2. This exploits the fact that, with the conventional fabrication processes for this type of integrated circuit, the gain of the parasitic pnp transistors Tp1, Tp2 is strongly influenced by these distances d1 and d2. Specifically, the gain of the parasitic transistor Tp2 is greater than the parasitic transistor Tp1 since the distance d2 is shorter than the distance d1.

Naturally, the two above-described arrangements, that is to say that relating to the dimensioning of the two resistors R3 and R4 and the topological arrangement relating to the mutual disposition of the transistors M10, M9 and the diodes D1 and D2, can be utilized contemporaneously thus increasing the security of operation of the circuit.

As can be easily established, the object of the invention is fully achieved in that the risk of spurious switching is avoided. It is noted moreover that this effect is obtained without additional circuit components, but simply by dimensioning and/or suitably arranging some already existing components.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

We claim:

1. An integrated control circuit for switching an electronic power switch, comprising:
   a control logic circuit for producing first and second voltage levels; and
   a level shifter having an input connected to the control logic circuit and an output connected to the electronic power switch, the level shifter including
   a bistable stage having first and second inputs, and an output defining the output of the level shifter;
   a first circuit branch having an output connected to the first input, and including a first transistor and a first resistor connected to the first transistor; and
   a second circuit branch having an output connected to the second input, and including a second transistor and a second resistor connected to the second transistor, the first and second transistors being switched alternately based on the first and second voltage levels produced by the control logic circuit, the second resistor having a higher resistance than the first resistor to ensure that the voltage level at the first input falls faster than the voltage level at the second input during discharge of parasitic capacitors associated with the first and second transistors.

2. The circuit according to claim 1 wherein the bistable stage comprises a flip-flop.

3. The circuit according to claim 2 wherein the flip-flop is of a dominant reset type having set and reset inputs and wherein the set input corresponds to the first input and the reset input corresponds to the second input.

4. The circuit according to claim 1 wherein the first and second transistors are p-channel MOS transistors.

5. The circuit according to claim 4 wherein the gate of one of the p-channel transistors is connected to the source of the other one of the p-channel transistors.

6. An integrated control circuit for switching an electronic power switch, comprising:
   a control logic circuit for producing first and second voltage levels; and
   a level shifter having an input connected to the control logic circuit and an output connected to the electronic power switch, the level shifter including
   a bistable stage having first and second inputs, and an output defining the output of the level shifter;
   a first circuit branch having an output connected to the first input, and including a first transistor and a first resistor connected to the first transistor; and
   a second circuit branch having an output connected to the second input, and including a second transistor and a second resistor connected to the second transistor, the first and second transistors being switched alternately based on the first and second voltage levels produced by the control logic circuit, wherein the circuit components of the level shifter are selectively disposed such that during discharge of parasitic capacitors associated with the first and second transistors, the voltage level at the first input falls faster than the voltage level at the second input.

7. The circuit according to claim 6 wherein the second resistor has a higher resistance than the first resistor.

8. The circuit according to claim 6 wherein each of the first and second circuit branches includes a diode connected to the respective transistor, and the first transistor is located at a further distance from the two diodes than the second transistor.

9. An integrated control circuit for switching an electronic power switch, comprising:
   a control logic circuit for producing first and second voltage levels; and
   a level shifter having an input connected to the control logic circuit and an output connected to the electronic power switch, the level shifter including
   a bistable stage having first and second inputs, and an output defining the output of the level shifter;
   a first circuit branch having an output connected to the first input, and including a first transistor and a first resistor connected to the first transistor; and
   a second circuit branch having an output connected to the second input, and including a second transistor and a second resistor connected to the second transistor, the first and second transistors being switched alternately based on the first and second voltage levels produced by the control logic circuit, wherein the voltage level at the first input falls faster than the second input during the discharge of parasitic capacitors associated with the first and second transistors.

10. The circuit according to claim 9 wherein the voltage level at the first input falls faster than the second input by having the second resistor with a higher resistance than the first resistor.

11. The circuit according to claim 9 wherein the voltage level at the first input falls faster than the second input by having circuit components of the level shifter selectively disposed such that during discharge of parasitic capacitors associated with the first and second transistors, the current flowing through the second resistor is higher than the current flowing through the first resistor.

12. The circuit according to claim 11 wherein the second resistor has a higher resistance than the first resistor.

13. The circuit according to claim 12 wherein each of the first and second circuit branches includes a diode connected to the respective transistor, and the first transistor is disposed at a further distance from the two-diodes than the second transistor.

14. An integrated control circuit for switching an electronic power switch connected in series with a load between first and second supply terminals, comprising a control logic circuit adapted to produce an output signal having two voltage levels relative to the voltage level of a reference terminal, a level shift circuit the input of which is connected to the output of the control logic circuit and an output of which is connected to the control terminal of the electronic switch, and adapted to produce at its output a signal having two voltage levels, corresponding to the signals from the control logic circuit, relative to the voltage level of the connection node between the electronic switch and the load, this level shift circuit comprising a bistable stage having a "set" input, a "reset" input and an output which is the output from the level shift circuit, first and second circuit branches connected between said connection node and a third supply terminal, respectively comprising a first transistor and a second transistor connected to the control logic circuit to be switched alternatively, a first resistor and a second resistor connected between the connection node and, respectively, the first transistor and the second transistor, the first resistor being connected to the "set" input and the second resistor being connected to the "reset" input of the bistable stage, and first and second parasitic current generators, respectively associated with the first and second transistors and adapted to inject current into the first and second resistors respectively, characterized in that the first resistor has a smaller resistance than that of the second resistor.

15. An integrated circuit for controlling the switching of an electronic power switch connected in series with a load between first and second supply terminals comprising:

a control logic circuit adapted to produce an output signal at two voltage levels relative to the voltage level of a reference terminal, a level shift circuit the input of which is connected to the output of the control logic circuit and the output of which is connected to the control terminal of the electronic switch and which is adapted to produce at its output a signal at two voltage levels corresponding to the control logic circuit signal, relative to the voltage level of the connection node between the electronic switch and the load, this level shift circuit comprising a bistable stage having a "set" input, a "reset" input and an output which is the output from the level shift circuit, first and second circuit branches connected between the said connection node and a third supply terminal, respectively comprising first and second transistors connected to the control logic circuit to be switched alternatively, first and second resistors connected between the connection node and the first and second transistor respectively, the first resistor being connected to the "set" input and the second resistor being connected to the "reset" input of the bistable stage, and first and second parasitic current generators, associated, respectively, with the first transistor and the second transistor and adapted to inject current into the first resistor and the second resistor, characterized in that the arrangement of circuit components is chosen in such a way that the overall current injected, during switching, by the first and second current generators, into the second resistor is greater than that injected by the same generators into the first resistor.

16. An integrated circuit according to claim 15, in which the first and second transistors are p-channel MOSFET transistors the drain terminals of which are connected to the first and second resistors respectively, in which the first and second circuit branches include respective first and second diodes connected between the source terminals of the first and second transistors respectively and the third supply terminal and in which the first and second current generators are parasitic bipolar transistors of pnp type having their emitter regions in common with the respective source region of the first and second transistors, a base region connected to the third supply terminal, and each having two collector regions which are in common with respective drain regions of the first and second transistors, the first transistor being formed in an integrated circuit zone which is located at a distance from the center of the zones in which the first and second diodes are formed which is greater than the distance between the zone in which the second transistor is formed and the center itself.

* * * * *

UNITED STATES PATENT AND TRADEMARK OFFICE
CERTIFICATE OF CORRECTION

PATENT NO.    : 5,552,731
DATED         : September 3, 1996
INVENTOR(S)   : Claudio Diazzi et al.

It is certified that error appears in the above identified patent and that said Letters Patent is hereby corrected as shown below:

On the title page in field [73] denoting the Assignee, please delete "SGS-Microelectronics" and insert therefor --SGS-Thomson Microelectronics--.

Signed and Sealed this

Twelfth Day of August, 1997

*Attest:*

BRUCE LEHMAN

*Attesting Officer*    *Commissioner of Patents and Trademarks*